US012785654B2

(12) United States Patent
Martin et al.

(10) Patent No.: US 12,785,654 B2
(45) Date of Patent: Nov. 3, 2026

(54) SUBSTRATE TOP SIDE ROUGHENING

(71) Applicant: TEXAS INSTRUMENTS INCORPORATED, Dallas, TX (US)

(72) Inventors: Keegan Shaun Martin, Dallas, TX (US); Ricky A. Jackson, Richardson, TX (US); Ting-Ta Yen, San Jose, CA (US); Huiyao Chen, Hillsboro, OR (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 804 days.

(21) Appl. No.: 17/589,465

(22) Filed: Jan. 31, 2022

(65) Prior Publication Data

US 2023/0246630 A1 Aug. 3, 2023

(51) Int. Cl.

| | |
|---|---|
| ***H03H 9/17*** | (2006.01) |
| ***H10N 30/87*** | (2023.01) |
| *H03H 9/13* | (2006.01) |

(52) U.S. Cl.
CPC .............. *H03H 9/17* (2013.01); *H10N 30/87* (2023.02); *H03H 9/131* (2013.01)

(58) Field of Classification Search
CPC ........ H03H 9/17; H03H 3/02; H03H 9/02047; H03H 9/173; H03H 9/54; Y10T 29/42; Y10T 29/49005; H10N 30/306; H10N 30/304
USPC ........................................ 29/594, 25.35, 846
See application file for complete search history.

(56) References Cited

U.S. PATENT DOCUMENTS

| | | | | |
|---|---|---|---|---|
| 8,631,547 | B2 * | 1/2014 | Barber .................. | H03H 9/172 29/25.35 |
| 9,503,047 | B2 | 11/2016 | Jacobsen et al. | |
| 10,574,204 | B2 * | 2/2020 | McCarron ............. | C23C 14/566 |
| 2017/0033766 | A1 | 2/2017 | Jacobsen et al. | |
| 2017/0302251 | A1 * | 10/2017 | Ruby ................. | H03H 9/02574 |

* cited by examiner

*Primary Examiner* — Craig M Schneider
(74) *Attorney, Agent, or Firm* — Zhenhai Fu; Charles F. Koch

(57) ABSTRACT

In some examples, a device includes a substrate, an oxide layer, and a resonator structure. The substrate is configured in a released-resonator architecture. The substrate has a first surface that is a roughened first surface and a second surface opposite to the first surface. The second surface exposed to a cavity of the released-resonator architecture.

17 Claims, 4 Drawing Sheets

SUBSTRATE TOP SIDE ROUGHENING

BACKGROUND

An acoustic resonator is a device that amplifies acoustic energy at a resonant frequency of the acoustic resonator. Some acoustic resonators, such as bulk acoustic wave (BAW) resonators, include a layer of piezoelectric material embedded between metal electrodes. Applying electrical energy to the metal electrodes causes the piezoelectric material to convert the electrical energy to mechanical energy. The mechanical energy may take the form of acoustic waves that propagate through the piezoelectric material. A frequency of the acoustic waves may be programmed based on a thickness of the piezoelectric material, which determines a resonant frequency of the acoustic resonator. The acoustic resonator may be suitable for implementation in electrical devices as an oscillator or other device which maintains a programmed frequency.

SUMMARY

In some examples, a device includes a substrate, an oxide layer, and a resonator structure. The substrate is configured in a released-resonator architecture. The substrate has a first surface that is a roughened first surface and a second surface opposite to the first surface. The second surface exposed to a cavity of the released-resonator architecture.

In some examples, a method includes providing a substrate having a released-resonator architecture, the substrate having a first surface and a second surface opposite to the first surface, the second surface exposed to a cavity of the released-resonator architecture. The method also includes roughening the first surface to form a roughened first surface. The method also includes burying the first surface with a material. The method also includes forming a resonator structure above the roughened first surface.

DETAILED DESCRIPTION

Figure 1:
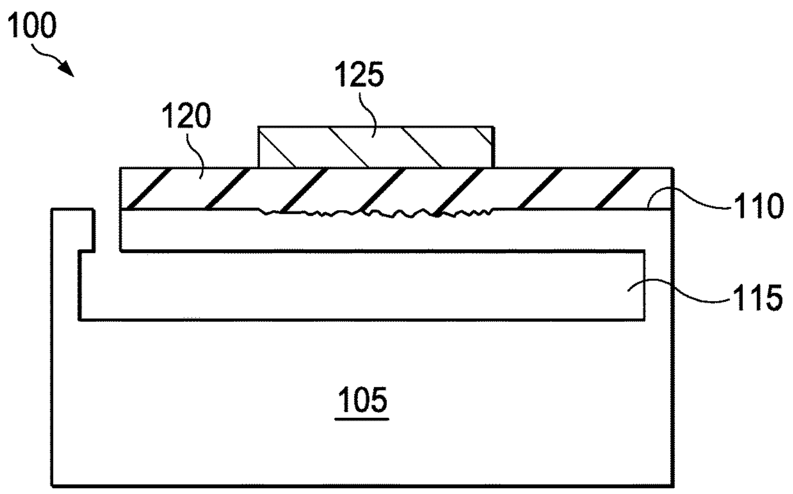
FIG. 1 is a cross-sectional view of an acoustic resonator, in accordance with various examples.

A resonant frequency of a resonator may be referred to as a normal mode of the resonator. For a BAW resonator, the normal mode may be defined at least partially according to a thickness and type of a piezoelectric material of a piezoelectric layer of the BAW resonator. However, acoustic waves propagating in the piezoelectric layer may not be confined to only the piezoelectric layer and may leak into other portions of a device that includes the BAW resonator. For example, some of the acoustic waves may leak into a substrate on which the BAW resonator is built. The substrate may have its own resonant frequency, which may vary from a resonant frequency of the BAW resonator. Some of the acoustic waves may be reflected back from the substrate to the BAW resonator at the resonant frequency of the substrate. The resonant frequency of the substrate may be referred to as a spurious mode of the resonator. The reflected acoustic waves may adversely affect operation of the BAW resonator, such as by altering the normal mode of the resonator from a performance which would occur in the absence of the spurious mode, causing frequency instability. Such frequency instability may render the BAW resonator unsuitable for certain precise timing applications.

Some approaches exist reducing, or mitigating, the effects of spurious modes. One such approach includes roughening a backside surface of the substrate, thereby causing the substrate to scatter the leaked acoustic waves rather than reflecting the acoustic waves directly back to the BAW resonator. However, such approaches may not be viable in implementations in which the backside of the substrate on which the BAW resonator is formed is not accessible. An example of such an implementation is a released-resonator architecture in which the BAW resonator is formed over a cavity and not in contact with the sides of the cavity. Such implementations may provide increased protection for the BAW resonator against the effects of physical stresses or forces altering the performance of the BAW resonator.

The description includes examples of BAW resonators that include topside roughening. The topside roughening may be applied to a substrate on which the BAW resonator is constructed. The topside roughening may mitigate effects of spurious modes associated with the BAW resonator and/or the substrate. In some examples, the topside roughening is applied to the substrate by etching a top surface of the substrate. In some examples, the topside roughening is applied to the substrate by depositing a material on a top surface of the substrate and etching the material. The material may be an acoustic impedance material, such as a material having a comparatively high acoustic impedance compared to other materials (e.g. a "high acoustic impedance material"). In some examples, the high acoustic impedance material may be a material such as tungsten (W) or titanium-tungsten (TiW). An oxide may be deposited over the roughened surface and the oxide may be planarized according to a chemical-mechanical polishing (CMP) process to create a substantially smooth and flush top surface of the oxide. The BAW resonator may be constructed on the top surface of the oxide by depositing various materials in layers, and processing the materials, according to any suitable process for circuit fabrication, the scope of which is not limited herein.

FIG. 1 is a cross-sectional view of an acoustic resonator 100, in accordance with various examples. In at least some examples, the resonator 100 has a released-resonator architecture. The resonator 100 includes a substrate 105 having a top surface 110. A cavity 115 exists in the resonator 100 resulting from the released-resonator architecture of the resonator 100. A portion of the top surface 110 of the substrate 105 is roughened, as is further described below. The resonator 100 also includes a material 120 deposited on the top surface 110. The resonator 100 also includes a resonator structure 125 deposited on top of the material 120. In various examples, the resonator structure 125 includes multiple layers of material deposited and processed before depositing a next layer. In some examples, although not shown, the resonator structure 125 may include a first metal layer forming a first electrode, a piezoelectric layer deposited on the first metal layer, and a second metal layer deposited on the piezoelectric layer to form a second electrode. However, in various other examples, the resonator structure 125 may be formed according to any suitable circuit fabrication process and may include any suitable material, the scope of which is not limited herein. In some examples, the resonator structure 125 may be referred to as an active area of the resonator 100.

In at least some examples, the resonator 100 is formed according to any suitable circuit fabrication process, the scope of which is not limited herein. To begin, the substrate 105 may be provided having the cavity 115. In some examples, the substrate 105 may be a silicon (Si) or Si-based substrate. The top surface 110 of the substrate 105 may be roughened according to any suitable etching process, the scope of which is not limited herein. For example, the substrate 105 may be etched according to a reactive ion etch gas chemistry to roughen the top surface 110 of the substrate 105. In some examples, only a portion of the top surface 110 is roughened, such as a portion of the top surface 110 on which the resonator structure 125 is to be constructed. The top surface 110 may be roughened with a topography having a scale of λ/4, or larger, where λ is an acoustic wavelength of the substrate 105 and the acoustic wavelength is an acoustic velocity of the substrate 105 divided by the frequency of the resonator.

Following roughening, the material 120 may be deposited on the top surface 110. In some examples, the material 120 is a high acoustic impedance material. In other examples, the material 120 is an oxide. Following deposition, the material 120 may be planarized. For example, the material 120 may be planarized according to a CMP process. Although not shown in FIG. 1, in examples in which the material 120 is an oxide, a high acoustic impedance material may be deposited on top of the material 120 before or after planarizing. In examples in which the high acoustic impedance material is deposited on top of the material 120 after the material 120 is planarized, the high acoustic impedance material may itself be planarized, or the high acoustic impedance material may be patterned and covered by an oxide that is planarized, such as described below with respect to FIG. 2.

In at least some examples, acoustic waves that leak out from the resonator structure 125 may be reflected by the top surface 110 back toward the resonator structure 125. However, resulting from the roughening of the top surface 110, the leaked acoustic waves may be reflected in a scattered manner such that effects of the reflected acoustic waves on a frequency response of the resonator structure 125 are reduced and performance of the resonator structure 125 is increased.

While FIG. 1 has been described with reference to the deposition of various materials (such as may be provided via chemical vapor deposition, or physical vapor deposition), processing, and then the deposition of other materials, the resonator 100 may undergo other processing steps and/or the deposition of other materials, not described herein. Such other processing or other material deposition may be prior to that which is described herein, subsequent to that which is described herein, or intermixed with that which is described herein.

Figure 2:
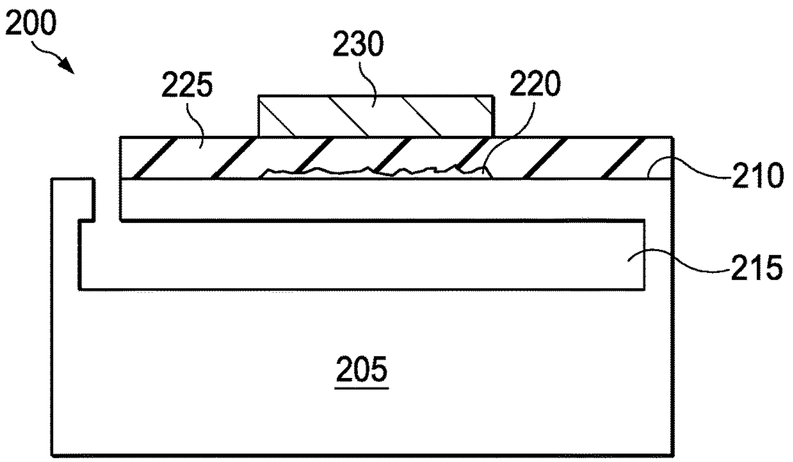
FIG. 2 is a cross-sectional view of an acoustic resonator, in accordance with various examples.

FIG. 2 is a cross-sectional view of an acoustic resonator 200, in accordance with various examples. In at least some examples, the resonator 200 has a released-resonator architecture. The resonator 200 includes a substrate 205 having a top surface 210. A cavity 215 exists in the resonator 200 resulting from the released-resonator architecture of the resonator 200. A material 220 is deposited on a portion of the top surface 210 to roughen the top surface 210 of the substrate 205. The resonator 200 also includes an oxide 225 deposited on the material 220. The resonator 200 also includes a resonator structure 230 deposited on top of the oxide 225. In various examples, the resonator structure 230 includes multiple layers of material deposited and processed before depositing a next layer. In some examples, although not shown, the resonator structure 230 may include a first metal layer forming a first electrode, a piezoelectric layer deposited on the first metal layer, and a second metal layer deposited on the piezoelectric layer to form a second electrode. However, in various other examples, the resonator structure 230 may be formed according to any suitable circuit fabrication process and may include any suitable material, the scope of which is not limited herein. In some examples, the resonator structure 230 may be referred to as an active area of the resonator 200.

In at least some examples, the resonator 200 is formed according to any suitable circuit fabrication process, the scope of which is not limited herein. To begin, the substrate 205 may be provided having the cavity 215. In some examples, the substrate 205 may be a silicon (Si) or Si-based substrate. The top surface 210 of the substrate 205 may be roughened prior to construction of the resonator structure 230. For example, the material 220 may be deposited on, or on a portion of, the top surface 210. In various examples, the material 220 is a high acoustic impedance material. After deposition, the material 220 may be roughened to provide the roughening to the top surface 210. For example, a patterning film (not shown) may be deposited on a portion of the material 220 in a given pattern. In at least some examples, the patterning film may be of a resist (e.g., photoresist) material. The material 220 may then be etched according to any suitable process, where a result of the etching is larger amounts of the material 220 remaining on the top surface 210 in areas in which the patterning film was deposited than remains on the top surface 210 in areas in which the patterning film was not deposited. The varied thickness of the material 220 remaining on the top surface 210 effectively roughen the top surface 210. In some examples, the material 220 may be etched in an out-of-focus mode, which may be contrary to conventional etching that is performed in-focus. For example, during an etching process, a photoresist material (not shown) may be disposed on the material 220. That photoresist material may undergo exposure through a photomask to impart a pattern into the photoresist material. In come conventional etching processing, such exposure is performed in-focus, to maintain an increased level of detail in the pattern. However, as described herein, the photoresist may be exposed in an out-of-focus manner to cause the photoresist surrounding the pattern to have a tapered profile. After etching, this tapered profile results in deeper (e.g., corresponding to an edge of the pattern where thinner photoresist is observed) and shallower (e.g., corresponding to a center of the pattern where thicker photoresist is observed) valleys in the material 220.

In other examples, a greyscale reticle (not shown) may be patterned the material 220 via photolithography. The greyscale reticle may have sub-micron feature sizes. The material 220 may then be etched according to any suitable process, where a result of the etching is areas of greater amounts of the material 220 remaining on the top surface 210 correspond to increased color density areas of the greyscale reticle and areas of lesser amounts of the material 220 remaining on the top surface 210 correspond to decreased color density areas of the greyscale reticle. The varied thickness of the material 220 remaining on the top surface 210 effectively roughen the top surface 210. The material 220 may be roughened with a topography having a scale of λ/4, or larger, where λ is an acoustic wavelength of the oxide 225. Following roughening, the oxide 225 may be deposited on the top surface 110. Following deposition, the oxide 225 may be planarized. For example, the oxide 225 may be planarized according to a CMP process.

In at least some examples, acoustic waves that leak out from the resonator structure 230 may be reflected by the top surface 210 back toward the resonator structure 230. However, resulting from the roughening of the top surface 210, the leaked acoustic waves may be reflected in a scattered manner such that effects of the reflected acoustic waves on a frequency response of the resonator structure 230 are reduced and performance of the resonator structure 230 is increased.

While FIG. 2 has been described with reference to the deposition of various materials (such as may be provided via chemical vapor deposition, or physical vapor deposition), processing, and then the deposition of other materials, the resonator 200 may undergo other processing steps and/or the deposition of other materials, not described herein. Such other processing or other material deposition may be prior to that which is described herein, subsequent to that which is described herein, or intermixed with that which is described herein.

Figure 3A:
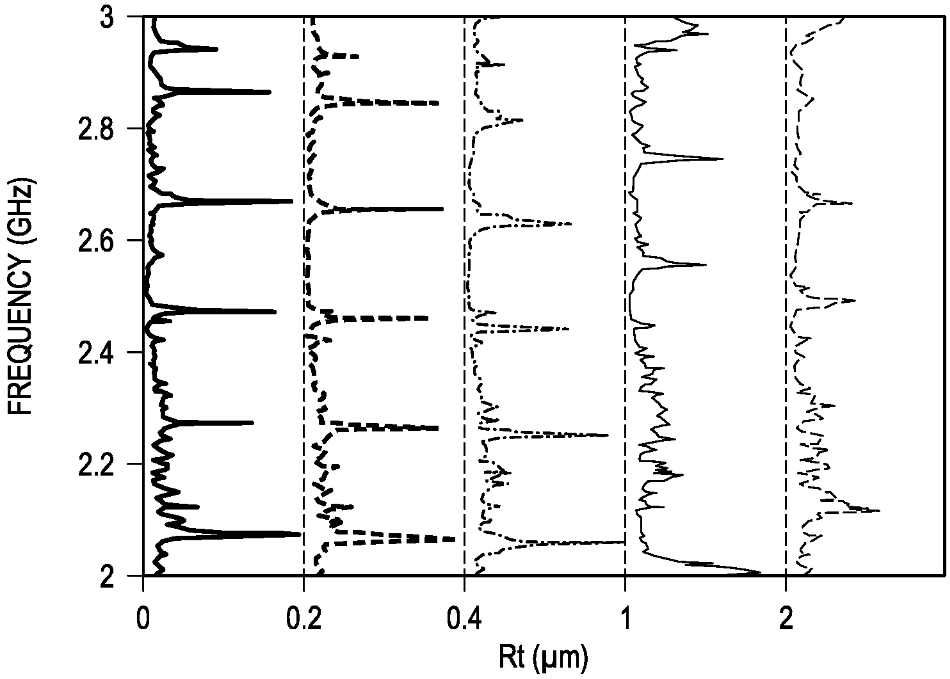
FIG. 3A is a graph of acoustic energy in a substrate, in accordance with various examples.
Figure 3B:
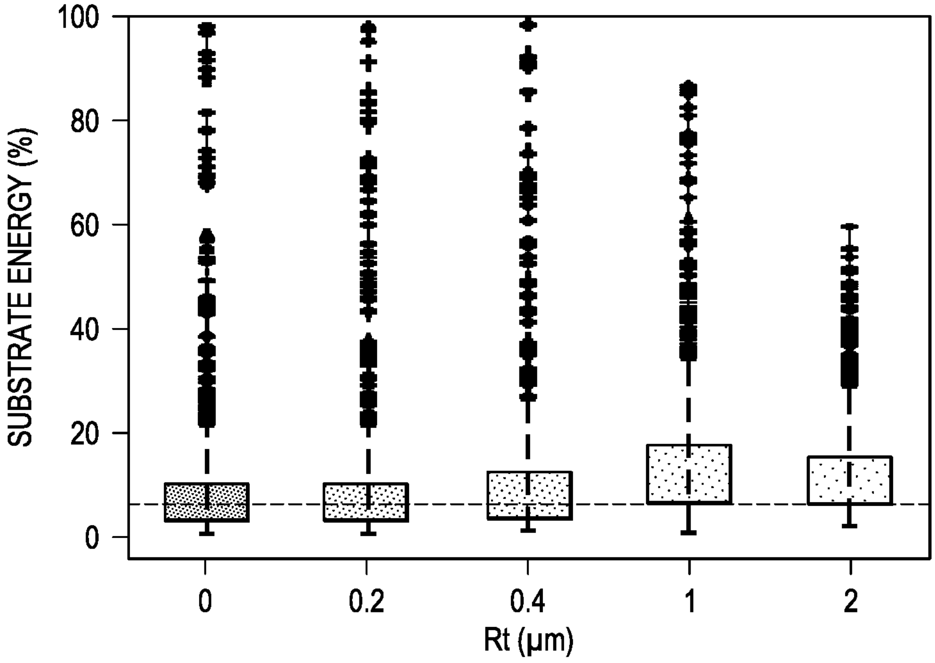
FIG. 3B is a graph of acoustic energy in a substrate, in accordance with various examples.
Figure 3C:
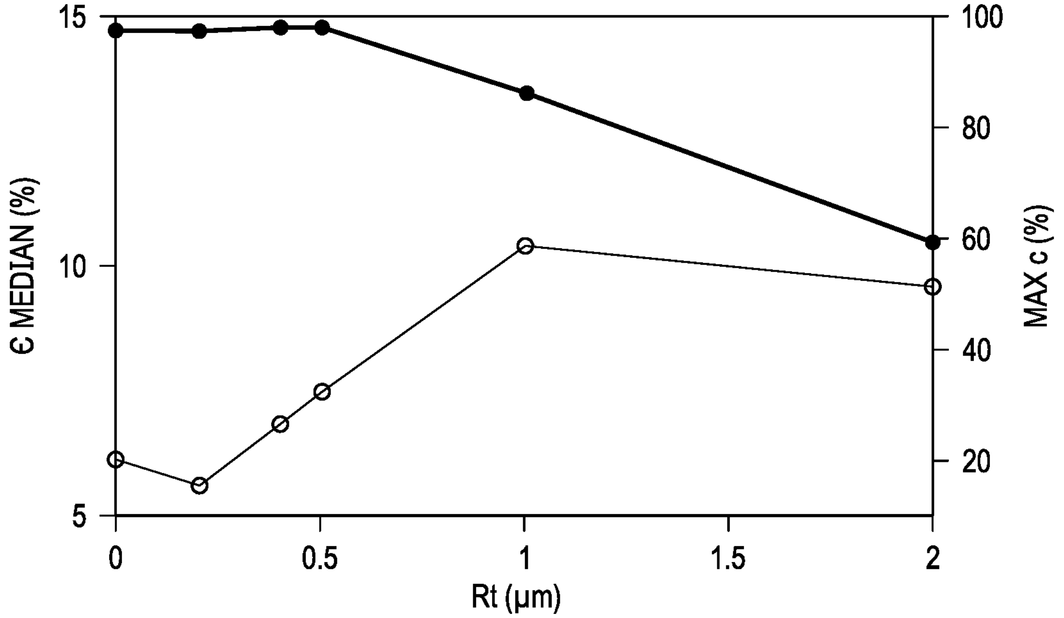
FIG. 3C is a graph of acoustic energy in a substrate, in accordance with various examples.

FIGS. 3A, 3B, and 3C are graphs of acoustic energy in a substrate, in accordance with various examples. FIGS. 3A, 3B, and 3C may be collectively referred to herein as FIG. 3. In at least some examples, FIG. 3 corresponds to a resonator having topside roughing as described above with respect to FIG. 1. FIG. 3A shows a frequency of the acoustic energy, in units of gigahertz (GHz), for various topology roughness values, in units of micrometers (um), noted in FIG. 3A as Rt. FIG. 3A shows a magnitude of response across a frequency range of interest, in units of gigahertz (GHz), for various topology roughness values, in units of micrometers (um), noted in FIG. 3A as Rt. A larger peak energy (e.g., longer line from left to right) for a given frequency represents a larger mode/resonance. In an ideal application, there is only a single resonance point at the frequency of operation of the resonator and all other peaks are smaller in value, or distanced in frequency from this resonance point to reduce their impact on the resonance point.

FIG. 3B shows an energy of the acoustic energy, as a percentage, for various topology roughness values, in units of micrometers (um), noted in FIG. 3B as Rt. The substrate energy percentage is a metric that quantitatively assesses performance of one roughness value compared to another, where a lower substrate energy percentage reflects increased performance. Each point for a given roughness represents a given frequency with some determined step size between frequencies, spanning across a frequency range of interest (e.g., 2-3 GHz in FIG. 3B). At each frequency, the amount of energy in the resonator, as well as the substrate are determined. The substrate energy percentage is then determined by E_substrate(f)/(E_substrate(f)+E_resonator(f))*100, where E_substrate(f) is the determined amount of energy in the substrate and E_resonator(f) is the determined amount of energy in the resonator. FIG. 3C shows a median and a max of energy of the substrate, as percentages, for various topology roughness values, in units of micrometers (um), noted in FIG. 3C as Rt. For example, FIG. 3C may be a graph of median and max values for the date of FIG. 3B.

Figure 4A:
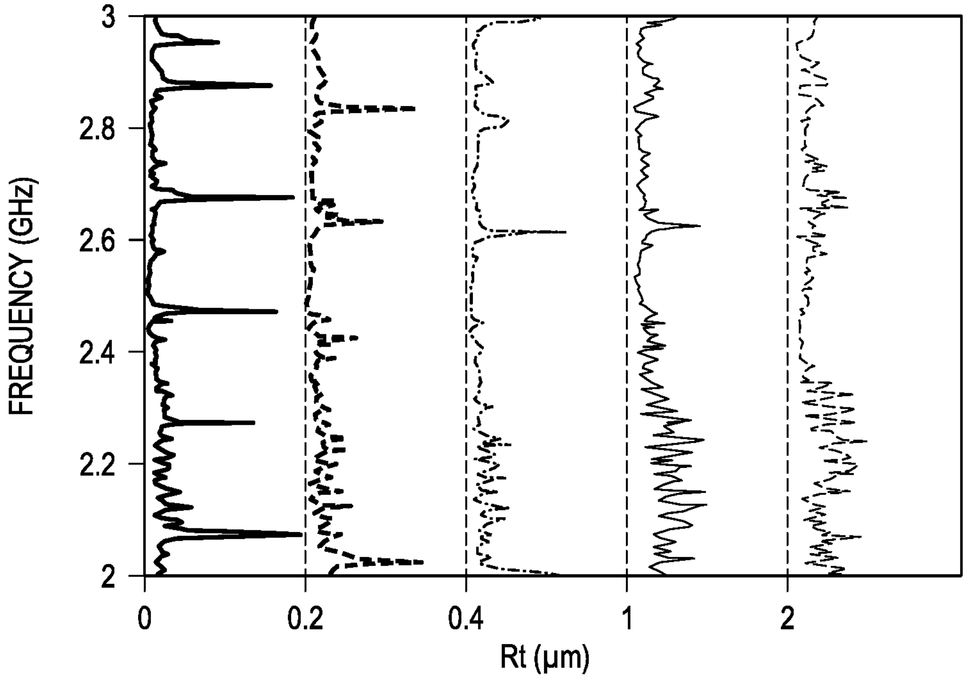
FIG. 4A is a graph of acoustic energy in a substrate, in accordance with various examples.
Figure 4B:
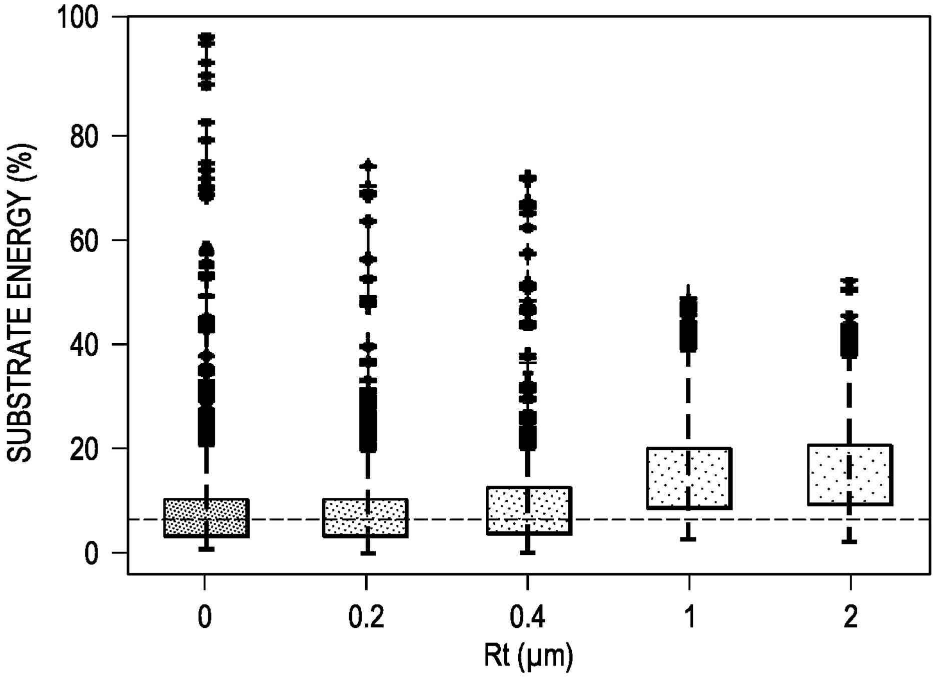
FIG. 4B is a graph of acoustic energy in a substrate, in accordance with various examples.
Figure 4C:
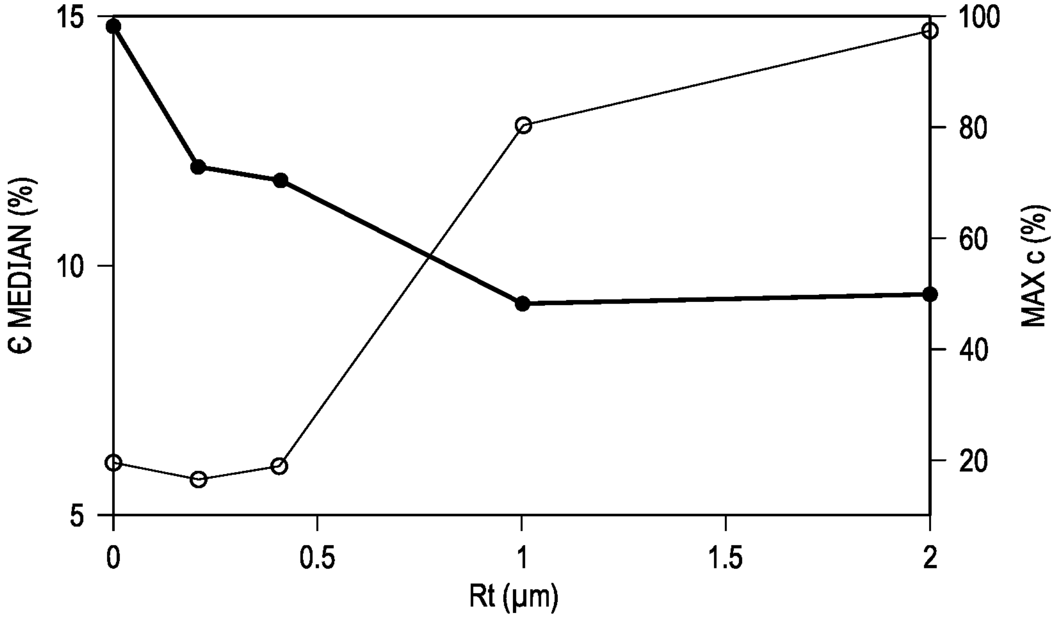
FIG. 4C is a graph of acoustic energy in a substrate, in accordance with various examples.

FIGS. 4A, 4B, and 4C are graphs of acoustic energy in a substrate, in accordance with various examples. FIGS. 4A, 4B, and 4C may be collectively referred to herein as FIG. 4. In at least some examples, FIG. 4 corresponds to a resonator having topside roughing as described above with respect to FIG. 2. In at least some examples, FIG. 4 is substantially the same as FIG. 3, but having values corresponding to the topside roughening as described with respect to FIG. 2.

Figure 5:
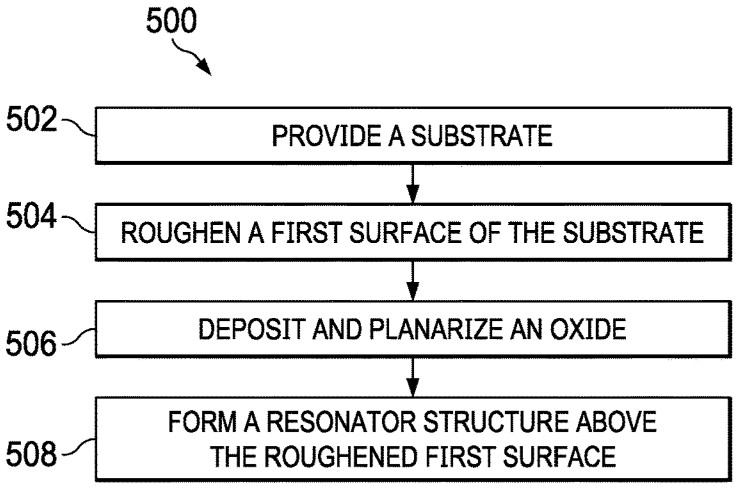
FIG. 5 is a flow diagram of a method of fabrication of a resonator, in accordance with various examples.

FIG. 5 is flow diagram of a method 500 for fabricating a resonator, in accordance with various examples. In at least some examples, the method 500 may be implemented to provide the resonator 100 of FIG. 1 and/or the resonator 200 of FIG. 2.

At operation 502, a substrate is provided. In at least some examples, the substrate is suitable for a released-resonator architecture, as described above. Accordingly, the substrate May include a first portion that surrounds a cavity, and a second portion that extends into or above the cavity, but does not contact the cavity.

At operation 504, a top surface of the substrate is roughened. In some examples, the top surface of the substrate is roughened by etching the top surface of the substrate. For example, the top surface of the substrate may be roughened by etching the top surface of the substrate according to a reactive ion etch gas chemistry to roughen the top surface. In at least some examples, a high acoustic impedance material is deposited on top of the etched top surface of the substrate. The high acoustic impedance material deposited on top of the etched top surface of the substrate may or may not itself be roughened, such as by a process described below.

In another example, the top surface of the substrate is roughened by depositing a material on the top surface of the substrate. The material may be a high acoustic impedance material. The material may be etched to remove a portion of the material to create a roughened texture on the top surface of the substrate. For example, the material may be etched based on a greyscale reticle or a patterning film to remove portions of the material to create varied thicknesses in the material to form the roughened texture. For example, the greyscale reticle may create a topography in a patterning film which then induces a corresponding topography in an underlying layer after etching. Performing the photolithography process largely out-of-focus can effectively create the same topography in the patterning film, though at a larger minimum resolution.

At operation 506, an oxide is deposited and planarized. The oxide may bury the roughened texture of the top surface of the substrate and provide a surface on which a resonator structure may be constructed. After deposition, the oxide may be planarized according to any suitable process, such as CMP.

In at least some examples, prior to planarizing, a high acoustic impedance material may be deposited on top of the oxide and the high acoustic impedance material may be planarized rather than the oxide. In some examples, the high acoustic impedance material may be roughened as described above with respect to operation 504, and oxide may be deposited on top of the roughened high acoustic impedance material and planarized.

At operation 508, a resonator structure is formed above the roughened top surface of the substrate. In some examples, the resonator structure includes first and second metal layers (e.g., electrodes) separated by a piezoelectric material to form an active area of an acoustic resonator. However, the resonator structure may take numerous forms, the scope of which is not limited herein.

While certain components may be described herein as being of a particular process technology, these components may be exchanged for components of other process technologies. Unless otherwise stated, "about," "approximately," or "substantially" preceding a value means+/−10 percent of the stated value. Modifications are possible in the described examples, and other examples are possible within the scope of the claims.

What is claimed is:

1. A device, comprising:

a substrate;

a non-planar surface over at least a portion of the substrate;

a layer over the non-planar surface and having a planar surface opposing the non-planar surface; and a resonator coupled to the planar surface of the layer, in which at least a portion of the layer is between the non-planar surface and the resonator.

2. The device of claim 1, wherein the non-planar surface is part of a surface of the substrate formed by etching the substrate.

3. The device of claim 2, wherein the etching is performed according to a reactive ion etch gas chemistry.

4. The device of claim 1, wherein the layer is a first layer, the non- planar surface is of a second layer over the substrate and formed by:

depositing the second layer on the first surface of the substrate; and roughening the second layer to form the non-planar surface.

5. The device of claim 1, wherein the layer has a different acoustic impedance from the substrate.

6. The device of claim 1, wherein the non-planar surface is formed according to a patterning film of photoresist material.

7. The device of claim 1, wherein the non-planar surface is formed according to a greyscale reticle.

8. The device of claim 1, wherein the layer is a first layer, and the device further comprises a second layer between the first layer and the resonator, the second layer having a different acoustic impedance from the first layer-structure.

9. The device of claim 1, wherein the layer is planarized prior to forming the resonator on the layer.

10. The device of claim 1, wherein the resonator is a bulk acoustic wave resonator.

11. The device of claim 1, wherein the non-planar surface is roughened at a micron scale with a topography having a scale of at least $\lambda/4$, where $\lambda$ is an acoustic wavelength of the substrate.

12. The device of claim 1, wherein the substrate includes a cavity, and the resonator and the non-planar surface are over the cavity.

13. The device of claim 1, wherein the resonator includes a first metal layer, a second metal layer, and a piezoelectric layer between the first and second metal layers.

14. The device of claim 1, wherein the substrate includes a silicon-based material.

15. The device of claim 12, wherein the substrate has a first portion and a second portion, the first and second portions having different materials, and the cavity is in one of the first or second portions.

16. A device, comprising:

a substrate;

a non-planar surface over a portion of the substrate;

a layer over the non-planar surface, wherein the layer comprises a first region overlying the non-planar surface and a second region extending laterally beyond the non-planar surface, the second region having a planar surface; and a resonator over the layer and the non-planar surface, in which at least a portion of the layer is between the non-planar surface and the resonator, and the second region extends beyond edges of the resonator.

17. A device, comprising:

a substrate;

a non-planar surface over at least a portion of the substrate;

a layer over the non-planar surface; and a bulk acoustic wave (BAW) resonator over the non-planar surface, in which at least a portion of the layer is between the non-planar surface and the BAW resonator.

* * * * *